United States Patent
Li et al.

(10) Patent No.: US 12,339,335 B2
(45) Date of Patent: Jun. 24, 2025

(54) DOUBLE PINNED MR MULTILAYER FILM, FULL BRIDGE MR SENSOR AND MANUFACTURING METHOD THEREFOR

(71) Applicant: ACEINNA Transducer Systems Co., Ltd., Wuxi (CN)

(72) Inventors: Dalai Li, Wuxi (CN); Zhengwei Huang, Wuxi (CN); Xin Wang, Wuxi (CN)

(73) Assignee: ACEINNA Transducer Systems Co., Ltd., Wuxi (CN)

( * ) Notice: Subject to any disclaimer, the term of this patent is extended or adjusted under 35 U.S.C. 154(b) by 193 days.

(21) Appl. No.: 17/968,848

(22) Filed: Oct. 19, 2022

(65) Prior Publication Data

US 2023/0121716 A1   Apr. 20, 2023

(30) Foreign Application Priority Data

Oct. 19, 2021   (CN) .......................... 202111215615.2

(51) Int. Cl.
| | |
|---|---|
| *G01R 33/09* | (2006.01) |
| *G01B 7/00* | (2006.01) |
| *G01B 7/30* | (2006.01) |
| *G01R 33/00* | (2006.01) |

(52) U.S. Cl.
CPC ....... *G01R 33/098* (2013.01); *G01R 33/0052* (2013.01); *G01R 33/093* (2013.01)

(58) Field of Classification Search
CPC .......... G01R 33/00; G01R 33/09; G01B 7/00; G01B 7/30
See application file for complete search history.

(56) References Cited

U.S. PATENT DOCUMENTS

| | | | |
|---|---|---|---|
| 2004/0072020 A1* | 4/2004 | Hasegawa | G01R 33/093 |
| 2021/0063505 A1* | 3/2021 | Mauri | G11B 5/3909 |
| 2021/0201943 A1* | 7/2021 | Zheng | H10N 50/10 |

FOREIGN PATENT DOCUMENTS

| | | |
|---|---|---|
| CN | 102270736 A | 12/2011 |
| CN | 104776794 A | 7/2015 |

OTHER PUBLICATIONS

"Notice of First Review Opinion" received for CN Application No. 202111215615.2, mailed on Mar. 12, 2025, 8 Pages with English Translation.

* cited by examiner

*Primary Examiner* — Neel D Shah
(74) *Attorney, Agent, or Firm* — EcoTech Law Group, P.C.

(57) ABSTRACT

A double pinned magnetoresistance (MR) multilayer film, a full bridge MR sensor using the double pinned MR multilayer film and a method for manufacturing the full bridge MR sensor are provided in the present invention. The double pinned MR multilayer film comprises: a buffer layer, a first antiferromagnetic layer, a first ferromagnetic layer, a first interlayer, a ferromagnetic reference layer, a spacer layer, a ferromagnetic free layer, a second interlayer, a second ferromagnetic layer, a second antiferromagnetic layer and a cover layer that are stacked in sequence. The first antiferromagnetic layer applies a first exchange bias to the first ferromagnetic layer, and the first ferromagnetic layer applies a first artificial antiferromagnetic coupling to the ferromagnetic reference layer through the first interlayer. The second antiferromagnetic layer applies a second exchange bias to the second ferromagnetic layer, and the second ferromagnetic layer applies a second artificial antiferromagnetic coupling to the ferromagnetic free layer through the second interlayer. The full bridge MR sensor can not only realize the (Continued)

full bridge function in a single chip, but also has small zero point, simple annealing process and low cost through two global annealing.

3 Claims, 4 Drawing Sheets

DOUBLE PINNED MR MULTILAYER FILM, FULL BRIDGE MR SENSOR AND MANUFACTURING METHOD THEREFOR

BACKGROUND OF THE INVENTION

Related Application

This application claims the priority from CN Patent Application having serial number 202111215615.2, filed on Oct. 19, 2021, which is incorporated herein by reference for all purpose.

Field of the Invention

The present invention relates to the technical field of magnetic sensors, and in particular, to a double pinned magnetoresistance (MR) multilayer film, a full bridge MR sensor using the double pinned MR multilayer film and a method for manufacturing the full bridge MR sensor.

Description of the Related Art

A conventional magnetoresistance (MR) sensor achieves a full bridge function by two methods usually. In the first Method, two chips are used, one of which is rotated 180 degrees relative to the other chip, and the two chips are interconnected by wire bonding to realize the full bridge function. In the second method, a magnetic moment of a MR sensitive area is locally programmed by laser local heating to realize the full bridge function. The disadvantage of the first method is that the assembly process is complex and the zero point of the MR sensor is large. The disadvantage of the second method is that the annealing process is complex and the cost is high.

Therefore, it is necessary to provide a technical solution to overcome the above problems.

SUMMARY OF THE INVENTION

One purpose of the present invention is to provide a double pinned MR multilayer film, a full bridge MR sensor using the double pinned MR multilayer film and a method for manufacturing the full bridge MR sensor, which can not only realize the full bridge function in a single chip, but also have small zero point, simple annealing process and low cost.

According to one aspect of the present invention, a double pinned MR multilayer film is provided in the present invention. The double pinned MR multilayer film comprises: a buffer layer, a first antiferromagnetic layer, a first ferromagnetic layer, a first interlayer, a ferromagnetic reference layer, a spacer layer, a ferromagnetic free layer, a second interlayer, a second ferromagnetic layer, a second antiferromagnetic layer, and a cover layer that are stacked in sequence. The first antiferromagnetic layer applies a first exchange bias to the first ferromagnetic layer. The first ferromagnetic layer applies a first artificial antiferromagnetic coupling to the ferromagnetic reference layer through the first interlayer. The second antiferromagnetic layer applies a second exchange bias to the second ferromagnetic layer. The second ferromagnetic layer applies a second artificial antiferromagnetic coupling to the ferromagnetic free layer through the second interlayer.

According to another aspect of the present invention, a full bridge MR sensor is provided in the present invention. The full bridge MR sensor comprises: a first double pinned MR multilayer film; a second double pinned MR multilayer film, wherein a first end of the first double pinned MR multilayer film and a first end of the second double pinned MR multilayer film are connected to a power terminal; a third double pinned MR multilayer film, wherein a second end of the first double pinned MR multilayer film and a first end of the third double pinned MR multilayer film are connected to a first signal terminal; a fourth double pinned MR multilayer film, wherein a second end of the second double pinned MR multilayer film and a first end of the fourth double pinned MR multilayer film are connected to a second signal terminal and a second end of the third double pinned MR multilayer film and a second end of the fourth double pinned MR multilayer film are connected to a ground terminal. Each of the first double pinned MR multilayer film, the second double pinned MR multilayer film, the third double pinned MR multilayer film, and the fourth double pinned MR multilayer film comprises: a buffer layer, a first antiferromagnetic layer, a first ferromagnetic layer, a first interlayer, a ferromagnetic reference layer, a spacer layer, a ferromagnetic free layer, a second interlayer, a second ferromagnetic layer, a second antiferromagnetic layer, and a cover layer that are stacked in sequence. A first annealing and a second annealing are successively performed on the full bridge MR sensor.

According to still another aspect of the present invention, a method for manufacturing a full bridge MR sensor is provided in the present invention. The method comprises: providing an initial full bridge MR sensor; performing a first annealing and a second annealing on the initial full bridge MR sensor successively. The initial full bridge MR sensor comprises a first double pinned MR multilayer film; a second double pinned MR multilayer film, wherein a first end of the first double pinned MR multilayer film and a first end of the second double pinned MR multilayer film are connected to a power terminal; a third double pinned MR multilayer film, wherein a second end of the first double pinned MR multilayer film and a first end of the third double pinned MR multilayer film are connected to a first signal terminal; a fourth double pinned MR multilayer film, wherein a second end of the second double pinned MR multilayer film and a first end of the fourth double pinned MR multilayer film are connected to a second signal terminal and a second end of the third double pinned MR multilayer film and a second end of the fourth double pinned MR multilayer film are connected to a ground terminal.

One of the objectives, advantages and benefits in the present invention is that the full bridge MR sensor in the present invention using the double pinned MR multilayer film not only realize the full bridge function in a single chip, but also has small zero point, simple annealing process and low cost through two global annealing.

There are many other objects, together with the foregoing attained in the exercise of the invention in the following description and resulting in the embodiment illustrated in the accompanying drawings.

BRIEF DESCRIPTION OF THE DRAWINGS

These and other features, aspects, and advantages of the present invention will become better understood with regard to the following description, appended claims, and accompanying drawings wherein:

DETAILED DESCRIPTION OF THE PREFERRED EMBODIMENTS

The detailed description of the invention is presented largely in terms of procedures, operations, logic blocks, processing, and other symbolic representations that directly or indirectly resemble the operations of data processing devices that may or may not be coupled to networks. These process descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be comprised in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To make the foregoing objectives, features, and advantages of the present invention clearer and easier to understand, the following further describes the present invention in detail with reference to the accompanying drawings and specific implementations.

According to one aspect of the present invention, the present invention provides a double pinned magnetoresistance (MR) multilayer film.

Figure 1:
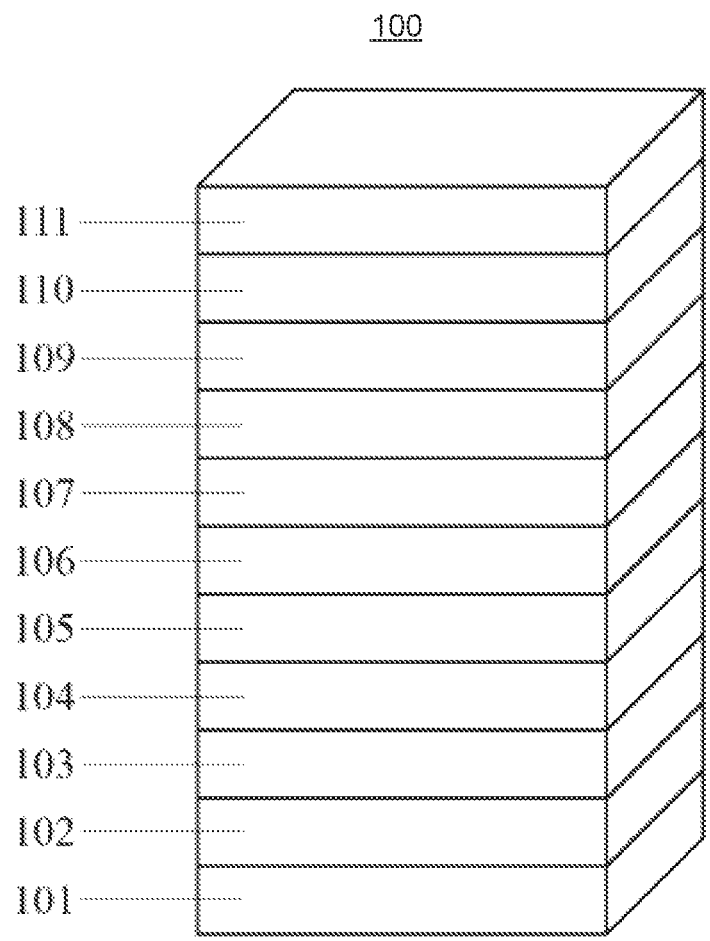
FIG. 1 is a schematic structural diagram of a double pinned magneto resistance (MR) multilayer film according to one embodiment of the present invention.

FIG. 1 is a schematic structural diagram of the double pinned MR multilayer film 100 of a full bridge MR sensor according to one embodiment of the present invention. As shown in FIG. 1, the double pinned MR multilayer film comprises a buffer layer 101, a first antiferromagnetic layer 102, a first ferromagnetic layer 103, a first interlayer 104, a ferromagnetic reference layer 105, a spacer layer 106, a ferromagnetic free layer 107, a second interlayer 108, a second ferromagnetic layer 109, a second antiferromagnetic layer 110, and a cover layer 111 that are stacked in sequence from bottom to top.

The buffer layer 101 is made of a conductive metal or a metal multilayer film, preferably made of Ta or Ru. The first antiferromagnetic layer 102 is made of PtMn. The first ferromagnetic layer 103 is made of a ferromagnetic metal or alloy, preferably made of Fe, Co, Ni, or CoFe(B). The first interlayer 104 is a metal layer, preferably made of Ru. The ferromagnetic reference layer 105 is made of a ferromagnetic metal or alloy, preferably made of Fe, Co, Ni, or CoFe(B). For a tunnel magnetoresistance (TMR), the spacer layer 106 is a barrier layer, preferably made of MgO, $Al_2O_3$, $MgAl_2O_4$, or MgZnO. For a giant magnetoresistance (GMR), the spacer layer 106 is a metal layer, preferably made of Cu. The ferromagnetic free layer 107 is made of a ferromagnetic metal or alloy, preferably made of Fe, Co, Ni, or CoFe(B). The second interlayer 108 is a metal layer, preferably made of Ru. The second ferromagnetic layer 109 is made of a ferromagnetic metal or alloy, preferably made of Fe, Co, Ni, or CoFe(B). The second antiferromagnetic layer 110 is made of IrMn or FeMn. The cover layer 111 is conductive metal or a metal multilayer film, preferably made of Ta or Ru.

The first antiferromagnetic layer 102 applies a first exchange bias to the first ferromagnetic layer 103, and the first ferromagnetic layer 103 applies a first artificial antiferromagnetic coupling to the ferromagnetic reference layer 105 through the first interlayer 104. The second antiferromagnetic layer 110 applies a second exchange bias to the second ferromagnetic layer 109, and the second ferromagnetic layer 109 applies a second artificial antiferromagnetic coupling to the ferromagnetic free layer 107 through the second interlayer 108. A length-width ratio of the double pinned MR multilayer film 100 is at least 2.

According to another aspect of the present invention, the present invention provides a full bridge MR sensor.

Figure 2:
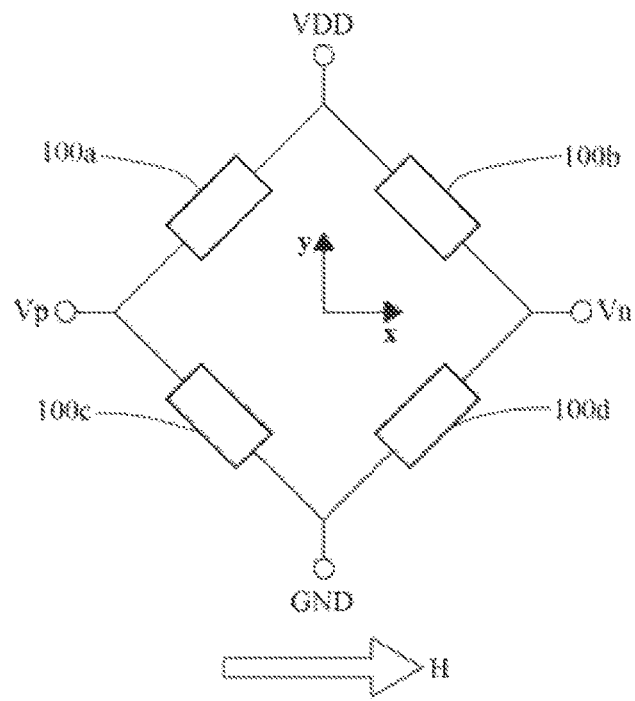
FIG. 2 is a schematic structural diagram of a full bridge MR sensor during a first annealing according to one embodiment of the present invention.

FIG. 2 is a schematic structural diagram of the full bridge MR sensor during a first annealing according to one embodiment of the present invention. Referring to FIG. 2, the full bridge MR sensor comprises a first double pinned MR multilayer film 100a, a second double pinned MR multilayer film 100b, a third double pinned MR multilayer film 100c, and a fourth double pinned MR multilayer film 100d. Each of the first double pinned MR multilayer film 100a, the second double pinned MR multilayer film 100b, the third double pinned MR multilayer film 100c, and the fourth double pinned MR multilayer film 100d may use the double pinned MR multilayer film 100 shown in FIG. 1. A first end of the first double pinned MR multilayer film 100a and a first end of the second double pinned MR multilayer film 100b are connected to a power terminal VDD. A second end of the first double pinned MR multilayer film 100a and a first end of the third double pinned MR multilayer film 100c are connected to a first signal terminal Vp. A second end of the second double pinned MR multilayer film 100b and a first end of the fourth double pinned MR multilayer film 100d are connected to a second signal terminal Vn. A second end of the third double pinned MR multilayer film 100c and a second end of the fourth double pinned MR multilayer film 100d are connected to a ground terminal GND.

For ease of description, an x-y plane coordinate system is defined. An axis X extends from left to right, an axis Y extends from bottom to top, and the axis X and the axis Y are perpendicular to each other. A long side of the first double pinned MR multilayer film 100a is parallel to a long side of the fourth double pinned MR multilayer film 100d, and an angle θ1 is formed between the long side of the first double pinned MR multilayer film 100a and the axis X. The angle θ1 is not equal to 0 degree and 90 degree. Preferably, the angle θ1 is between 5 degree and 85 degree. A long side of the second double pinned MR multilayer film 100b is parallel to a long side of the third double pinned MR multilayer film 100c, and an angle θ2 is formed between the long side of the second double pinned MR multilayer film and the axis X, wherein θ1+θ2=180°.

The first annealing comprises: increasing a temperature from a room temperature to a first temperature T1, applying a magnetic field H, and decreasing the temperature from the first temperature T1 to the room temperature. A direction of the magnetic field H is along the axis X. Through the first annealing, magnetocrystalline (MC) anisotropy of the first ferromagnetic layer 103, the ferromagnetic reference layer 105, the ferromagnetic free layer 107, and the second ferromagnetic layer 109 is defined, and a magnetization intensity direction (along a +X direction) and the first exchange bias (along the +X direction) of the first ferromagnetic layer 103 and the magnetization intensity direction (along the +X direction) of the ferromagnetic reference layer 105 are defined.

In a specific embodiment shown in FIG. 2, the magnetocrystalline anisotropy of the first ferromagnetic layer 103, the ferromagnetic reference layer 105, the ferromagnetic free layer 107, and the second ferromagnetic layer 109 is parallel to the axis X (or the direction of the magnetic field H). The magnetization intensity direction of the first ferromagnetic layer 103 is along the +X direction, the first exchange bias of the first ferromagnetic layer 103 is along the +X direction. The magnetization intensity direction of the ferromagnetic reference layer 105 is along the −X direction. That is to say, the magnetization intensity direction and the first exchange bias of the first ferromagnetic layer 103 and the magnetization intensity direction of the ferromagnetic reference layer 105 are parallel to the axis X (or the direction of the magnetic field H), and the magnetization intensity direction and the first exchange bias of the first ferromagnetic layer 103 are opposite to the magnetization intensity direction of the ferromagnetic reference layer 105.

Figure 3:
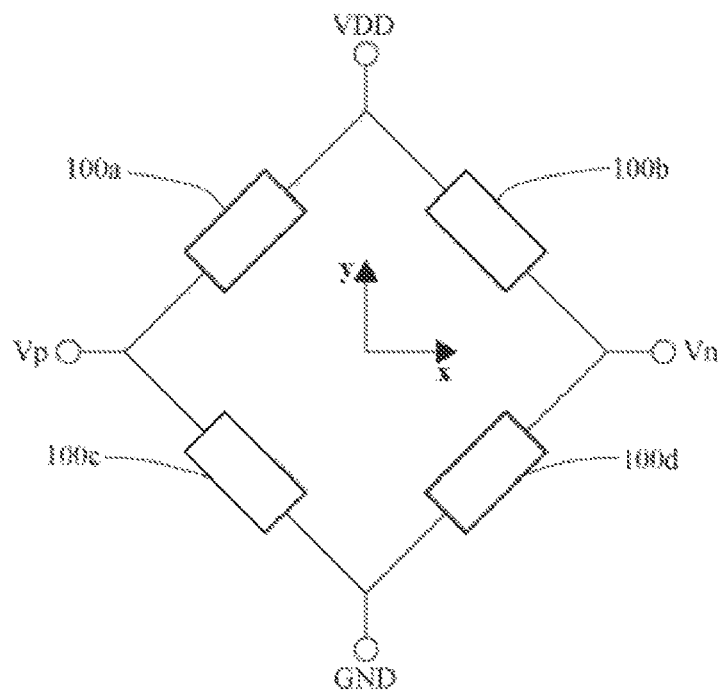
FIG. 3 is a schematic structural diagram of the full bridge MR sensor during a second annealing according to one embodiment of the present invention.

FIG. 3 is a schematic structural diagram of the full bridge MR sensor during the second annealing according to one embodiment of the present invention. Referring to FIG. 3, the second annealing comprises: increasing a temperature from a room temperature to a second temperature T2, and decreasing the temperature from the second temperature T2 to the room temperature without applying a magnetic field. The second temperature T2 is greater than a blocking temperature of the second antiferromagnetic layer 110, and the second temperature T2 is less than the first temperature T1. A magnetization intensity direction and a second exchange bias of the second ferromagnetic layer 109 and a magnetization intensity direction of the ferromagnetic free layer 107 are defined through the second annealing by using shape anisotropy and magnetocrystalline anisotropy. In one embodiment, the first temperature T1 is between 270° C. and 350° C., the second temperature T2 is between 170° C. and 350° C., and the magnetic field H is between 3000 G and 30000 G.

Figure 4:
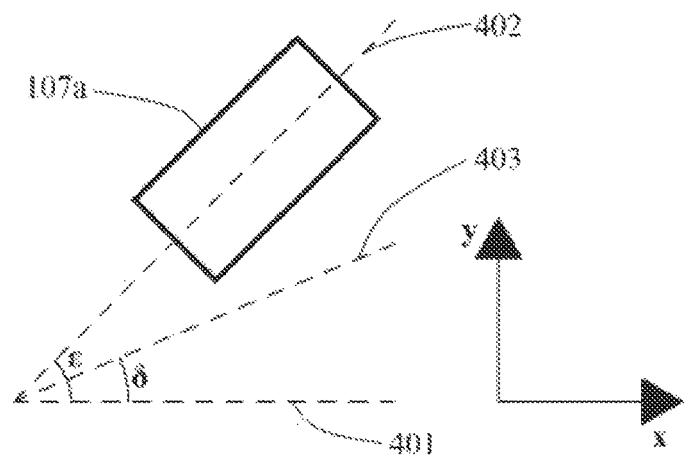
FIG. 4 is a schematic structural diagram of a ferromagnetic free layer of the full bridge MR sensor after the second annealing according to one embodiment of the present invention.
Figure 5:
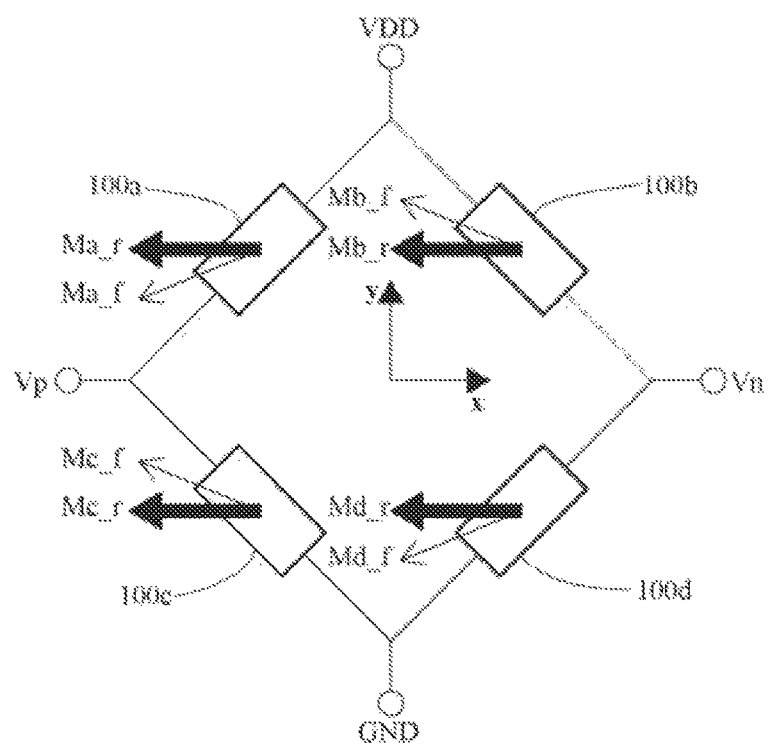
FIG. 5 is a schematic structural diagram of magnetization intensity directions of a ferromagnetic reference layer and the ferromagnetic free layer of the full bridge MR sensor after the second annealing according to one embodiment of the present invention.

In order to describe the magnetization intensity direction and the second exchange bias of the second ferromagnetic layer 109 and the magnetization intensity direction of the ferromagnetic free layer 107, the ferromagnetic free layer 107a in the first double pinned MR multilayer film 100a is used as an example. FIG. 4 is a schematic structural diagram of a ferromagnetic free layer 107a of the full bridge MR sensor after the second annealing according to one embodiment of the present invention. As shown in FIG. 4, a magnetocrystalline anisotropy axis 401 is along the axis X (or the direction of the magnetic field H), an angle between a shape anisotropy axis 402 along the long side of the double pinned MR multilayer film 100a and the axis X (or the direction of the magnetic field H) is ε, and an angle between an effective anisotropy axis 403 and the axis X is δ. According to the principle of energy minimization, it can be determined that the magnetization intensity direction of the ferromagnetic free layer 107a is 180+δ, wherein δ=ε−0.5 atan{$K_1$ sin(2ε)/[$K_d$+$K_1$ cos(2ε)]}, $K_1$ is magnetocrystalline anisotropy energy, $K_d$ is shape anisotropy energy, ε is the angle between the shape anisotropy axis 402 of the ferromagnetic free layer 107a after the second annealing and the axis X, and δ is the angle between the effective anisotropy axis 403 of the ferromagnetic free layer 107a of the first double pinned MR multilayer film 100a after the second annealing and the axis X. The magnetocrystalline anisotropy axis 401 of the ferromagnetic free layer 107a of the first double pinned MR multilayer film 100a after the second annealing is along the axis X. That is to say, the magnetization intensity direction and the second exchange bias of the second ferromagnetic layer 109 and the magnetization intensity direction of the ferromagnetic free layer 107 are defined through the second annealing by using the shape anisotropy and the magnetocrystalline anisotropy, FIG. 5 is a schematic structural diagram of the magnetization intensity directions of the ferromagnetic reference layer and the ferromagnetic free layer of the full bridge MR sensor after the second annealing according to one embodiment of the present invention. As shown in FIG. 5, for the first double pinned MR multilayer film 100a, the magnetization intensity direction of the ferromagnetic reference layer 105a is Ma_r, and along the −X direction, the magnetization intensity direction of the ferromagnetic free layer 107a is Ma_f, and the angle between the magnetization intensity direction of the ferromagnetic free layer and the axis X (or the direction of the magnetic field H) is 180+δ. For the second double pinned MR multilayer film 100b, the magnetization intensity direction of the ferromagnetic reference layer 105b is Mb_r, along the −X direction, the magnetization intensity direction of the ferromagnetic free layer 107b is Mb_f, and the angle between the magnetization intensity direction of the ferromagnetic free layer and the axis X (or the direction of the magnetic field H) is 180−δ. For the third double pinned MR multilayer film 100c, the magnetization intensity direction of the ferromagnetic reference layer 105c is Mc_r, and along the −X direction, the magnetization intensity direction of the ferromagnetic free layer 107c is Mc_f, and the angle between the magnetization intensity direction of the ferromagnetic free layer and the axis X (or the direction of the magnetic field H) is 180−δ. For the fourth double pinned MR multilayer film 100d, the magnetization intensity direction of the ferromagnetic reference layer 105d is Md_r, and along the −X direction, the magnetization intensity direction of the ferromagnetic free layer 107d is Md_f, and the angle between the magnetization intensity direction of the ferromagnetic free layer and the axis X (or the direction of the magnetic field H) is 180+δ. A sensitive axis of the full bridge MR sensor shown in FIG. 5 is perpendicular to the direction of the magnetic field H applied during the first annealing. That is to say, the sensitive axis is along the Y-axis direction.

Figure 6:
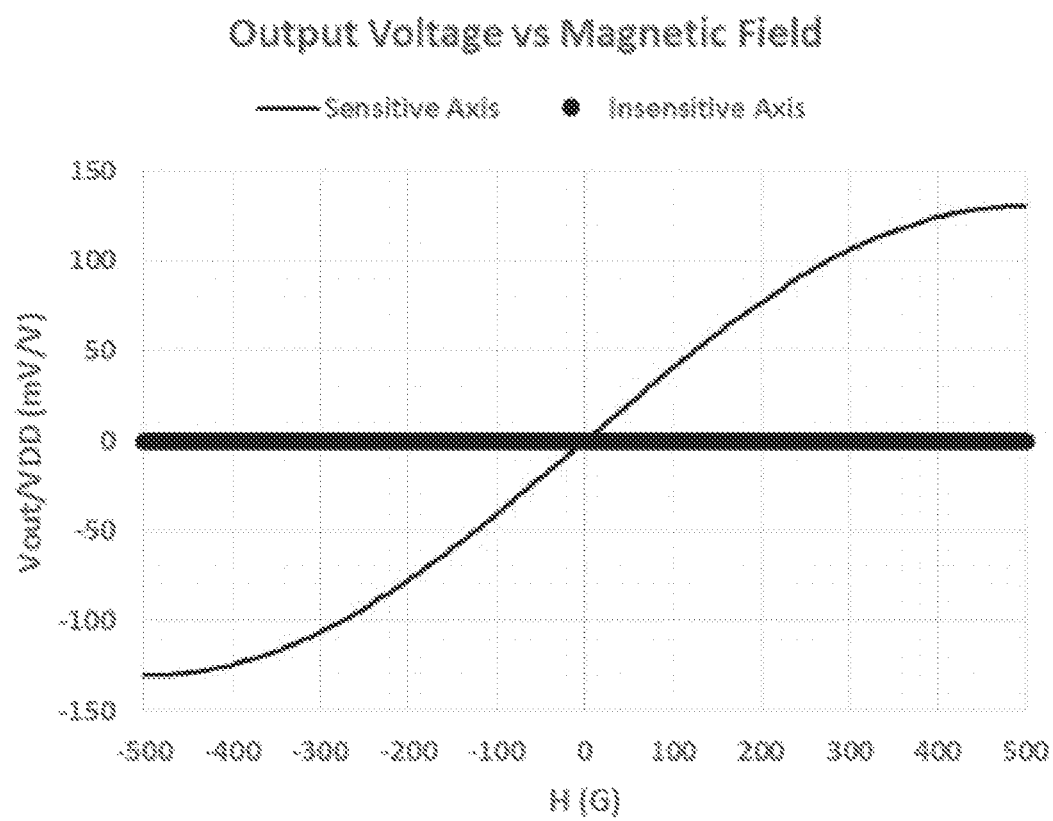
FIG. 6 is a response curve of an output of the full bridge MR sensor to a magnetic field after the first annealing and the second annealing according to one embodiment of the present invention.

FIG. 6 is a response curve of an output of the full bridge MR sensor to a magnetic field after the first annealing and the second annealing according to one embodiment of the present invention. As shown in FIG. 6, when an external magnetic field is applied along the sensitive axis, within a range of +/−100 G, a voltage output linearly responds to the external magnetic field with a sensitivity of 0.4 mV/V/G.

When the external magnetic field is applied along an insensitive axis, the voltage output does not change with the external magnetic field.

According to still another aspect of the present invention, the present invention provides a method for manufacturing the full bridge MR sensor.

Figure 7:
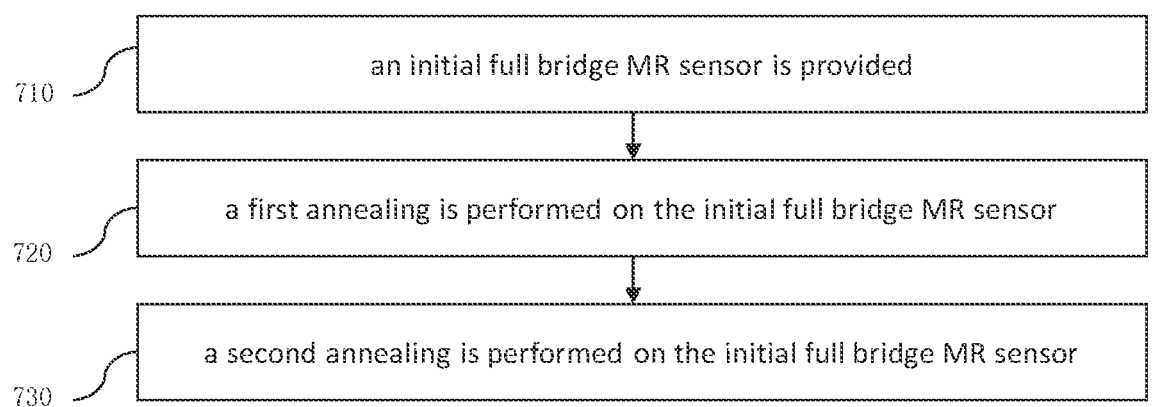
FIG. 7 is a flowchart of a method for manufacturing the full bridge MR sensor according to one embodiment of the present invention.

FIG. 7 is a flowchart of the method for manufacturing the full bridge MR sensor according to one embodiment of the present invention. The method for manufacturing the full bridge MR sensor shown in FIG. 7 comprises the following operations.

At 710, an initial full bridge MR sensor is provided.

Referring to FIG. 2, the initial full bridge MR sensor comprises a first double pinned MR multilayer film 100a, a second double pinned MR multilayer film 100b, a third double pinned MR multilayer film 100c, and a fourth double pinned MR multilayer film 100d. Each of the first double pinned MR multilayer film 100a, the second double pinned MR multilayer film 100b, the third double pinned MR multilayer film 100c, and the fourth double pinned MR multilayer film 100d may all use the double pinned MR multilayer film 100 shown in FIG. 1. A first end of the first double pinned MR multilayer film 100a and a first end of the second double pinned MR multilayer film 100b are connected to a power terminal VDD. A second end of the first double pinned MR multilayer film 100a and a first end of the third double pinned MR multilayer film 100c are connected to a first signal terminal Vp. A second end of the second double pinned MR multilayer film 100b and a first end of the fourth double pinned MR multilayer film 100d are connected to a second signal terminal Vn. A second end of the third double pinned MR multilayer film 100c and a second end of the fourth double pinned MR multilayer film 100d are connected to a ground terminal GND.

At 720, a first annealing is performed on the initial full bridge MR sensor.

Referring to FIG. 2, for ease of description, an x-y plane coordinate system is defined. An axis X extends from left to right, an axis Y extends from bottom to top, and the axis X and the axis Y are perpendicular to each other. A long side of the first double pinned MR multilayer film 100a is parallel to a long side of the fourth double pinned MR multilayer film 100d, and an angle θ1 is formed between the long side of the first double pinned MR multilayer film 100a and the axis X. Preferably, the angle θ1 is between 5 degrees and 85 degrees. A long side of the second double pinned MR multilayer film 100b is parallel to a long side of the third double pinned MR multilayer film 100c, and an angle θ2 is formed between the long side of the second double pinned MR multilayer film and the axis X, wherein θ1+θ2=180°.

The first annealing comprises: increasing a temperature from a room temperature to a first temperature T1, applying a magnetic field H, and decreasing the temperature from the first temperature T1 to the room temperature. A direction of the magnetic field H is along the axis X. Through the first annealing, magnetocrystalline (MC) anisotropy of the first ferromagnetic layer 103, the ferromagnetic reference layer 105, the ferromagnetic free layer 107, and the second ferromagnetic layer 109 is defined, and a magnetization intensity direction (along a +X direction) and the first exchange bias (along a +X direction) of the first ferromagnetic layer 103 and the magnetization intensity direction (along a +X direction) of the ferromagnetic reference layer 105 are defined.

In a specific embodiment shown in FIG. 2, the magnetocrystalline anisotropy of the first ferromagnetic layer 103, the ferromagnetic reference layer 105, the ferromagnetic free layer 107, and the second ferromagnetic layer 109 is parallel to the axis X (or the direction of the magnetic field H). The magnetization intensity direction of the first ferromagnetic layer 103 is along the +X direction, the first exchange bias of the first ferromagnetic layer 103 is along the +X direction. The magnetization intensity direction of the ferromagnetic reference layer 105 is along the −X direction. That is to say, the magnetization intensity direction and the first exchange bias of the first ferromagnetic layer 103 and the magnetization intensity direction of the ferromagnetic reference layer 105 are parallel to the axis X (or the direction of the magnetic field H), and the magnetization intensity direction and the first exchange bias of the first ferromagnetic layer 103 are opposite to the magnetization intensity direction of the ferromagnetic reference layer 105.

At 730, a second annealing is performed on the initial full bridge MR sensor.

FIG. 3 is a schematic structural diagram of the full bridge MR sensor during the second annealing according to one embodiment of the present invention. Referring to FIG. 3, the second annealing comprises: increasing a temperature from a room temperature to a second temperature T2, and decreasing the temperature from the second temperature T2 to the room temperature without applying a magnetic field. The second temperature T2 is greater than a blocking temperature of the second antiferromagnetic layer 110, and the second temperature T2 is less than the first temperature T1. A magnetization intensity direction and a second exchange bias of the second ferromagnetic layer 109 and a magnetization intensity direction of the ferromagnetic free layer 107 are defined through the second annealing by using shape anisotropy and magnetocrystalline anisotropy. In one embodiment, the first temperature T1 is between 270° C. and 350° C., the second temperature T2 is between 170° C. and 350° C., and the magnetic field H is between 3000 G and 30000 G.

In order to describe the magnetization intensity direction and the second exchange bias of the second ferromagnetic layer 109 and the magnetization intensity direction of the ferromagnetic free layer 107, the ferromagnetic free layer 107a in the first double pinned MR multilayer film 100a is used as an example. FIG. 4 is a schematic structural diagram of a ferromagnetic free layer of the full bridge MR sensor after the second annealing according to one embodiment of the present invention. As shown in FIG. 4, a magnetocrystalline anisotropy axis 401 is along the axis X (or the direction of the magnetic field H), an angle between a shape anisotropy axis 402 along the long side of the double pinned MR multilayer film 100a and the axis X (or the direction of the magnetic field H) is ε, and an angle between an effective anisotropy axis 403 and the axis X is δ. According to the principle of energy minimization, it can be determined that the magnetization intensity direction of the ferromagnetic free layer 107a is 180+δ, wherein δ=ε−0.5 atan{$K_\perp$ sin(2ε) [$K_d$+$K_\perp$ cos(2ε)]}, $K_\perp$ is magnetocrystalline anisotropy energy, $K_d$ is shape anisotropy energy, ε is the angle between the shape anisotropy axis 402 of the ferromagnetic free layer 107a after the second annealing and the axis X, and δ is the angle between the effective anisotropy axis 403 of the ferromagnetic free layer 107a of the first double pinned MR multilayer film 100a after the second annealing and the axis X. The magnetocrystalline anisotropy axis 401 of the ferromagnetic free layer 107a of the first double pinned MR multilayer film 100a after the second annealing is along the axis X. That is to say, the magnetization intensity direction and the second exchange bias of the second ferromagnetic layer 109 and the magnetization intensity direction of the ferromagnetic free layer 107 are defined through the second annealing by using the shape anisotropy and the magnetocrystalline anisotropy.

FIG. 5 is a schematic structural diagram of the magnetization intensity directions of the ferromagnetic reference layer and the ferromagnetic free layer of the full bridge MR sensor after the second annealing according to one embodiment of the present invention. As shown in FIG. 5, for the first double pinned MR multilayer film 100a, the magnetization intensity direction of the ferromagnetic reference layer 105a is Ma_r, and along the −X direction, the magnetization intensity direction of the ferromagnetic free layer 107a is Ma_f, and the angle between the magnetization intensity direction of the ferromagnetic free layer and the axis X (or the direction of the magnetic field H) is 180+δ. For the second double pinned MR multilayer film 100b, the magnetization intensity direction of the ferromagnetic reference layer 105b is Mb_r, along the −X direction, the magnetization intensity direction of the ferromagnetic free layer 107b is Mb_f, and the angle between the magnetization intensity direction of the ferromagnetic free layer and the axis X (or the direction of the magnetic field H) is 180−δ. For the third double pinned MR multilayer film 100c, the magnetization intensity direction of the ferromagnetic reference layer 105c is Mc_r, and along the −X direction, the magnetization intensity direction of the ferromagnetic free layer 107c is Mc_f, and the angle between the magnetization intensity direction of the ferromagnetic free layer and the axis X (or the direction of the magnetic field H) is 180−δ. For the fourth double pinned MR multilayer film 100d, the magnetization intensity direction of the ferromagnetic reference layer 105d is Md_r, and along the −X direction, the magnetization intensity direction of the ferromagnetic free layer 107d is Md_f, and the angle between the magnetization intensity direction of the ferromagnetic free layer and the axis X (or the direction of the magnetic field H) is 180+δ. A sensitive axis of the full bridge MR sensor shown in FIG. 5 is perpendicular to the direction of the magnetic field H applied during the first annealing. That is to say, the sensitive axis is along the Y-axis direction.

FIG. 6 is a response curve of an output of the full bridge MR sensor to a magnetic field after the first annealing and the second annealing according to one embodiment of the present invention. As shown in FIG. 6, when an external magnetic field is applied along the sensitive axis, within a range of +/−100 G, a voltage output linearly responds to the external magnetic field with a sensitivity of 0.4 mV/V/G. When the external magnetic field is applied along an insensitive axis, the voltage output does not change with the external magnetic field.

In conclusion, the full bridge MR sensor in the present invention using the double pinned MR multilayer film not only realize the full bridge function in a single chip, but also has small zero point, simple annealing process and low cost through two global annealing.

Although preferred embodiments of the present invention have been described, additional changes and modifications to these embodiments may be made once the basic creative concepts are known to those skilled in the art. The appended claims are therefore intended to be interpreted to comprise preferred embodiments and all changes and modifications falling within the scope of this application.

Obviously, a person skilled in the art may make various changes and variations to the application without departing from the spirit and scope of the application. Thus, if these modifications and variations of this application fall within the scope of the claims and their equivalent technologies, the application is also intended to comprise these changes and variations.

The invention claimed is:

1. A method for manufacturing a full bridge MR sensor, comprising:
   providing an initial full bridge MR sensor, comprising:
      a first double pinned MR multilayer film;
      a second double pinned MR multilayer film, wherein a first end of the first double pinned MR multilayer film and a first end of the second double pinned MR multilayer film are connected to a power terminal;
      a third double pinned MR multilayer film, wherein a second end of the first double pinned MR multilayer film and a first end of the third double pinned MR multilayer film are connected to a first signal terminal;
      a fourth double pinned MR multilayer film, wherein a second end of the second double pinned MR multilayer film and a first end of the fourth double pinned MR multilayer film are connected to a second signal terminal and a second end of the third double pinned MR multilayer film and a second end of the fourth double pinned MR multilayer film are connected to a ground terminal; and
   successively performing, after the providing the initial full bridge MR sensor, a first annealing and a second annealing on the initial full bridge MR sensor;
   wherein each of the first double pinned MR multilayer film, the second double pinned MR multilayer film, the third double pinned MR multilayer film, and the fourth double pinned MR multilayer film comprises a buffer layer, a first antiferromagnetic layer, a first ferromagnetic layer, a first interlayer, a ferromagnetic reference layer, a spacer layer, a ferromagnetic free layer, a second interlayer, a second ferromagnetic layer, a second antiferromagnetic layer, and a cover layer that are stacked in sequence, and
   a magnetization intensity direction and a second exchange bias of a second ferromagnetic layer and a magnetization intensity direction of the ferromagnetic free layer are defined by using shape anisotropy and magnetocrystalline anisotropy through the second annealing; and
   the second annealing comprises increasing a temperature from a room temperature to a second temperature T2, and decreasing the temperature from the second temperature T2 to the room temperature without applying a magnetic field, wherein the second temperature T2 is greater than a blocking temperature of the second antiferromagnetic layer, and the second temperature T2 is less than the first temperature T1.

2. The method according to claim 1, wherein a long side of the first double pinned MR multilayer film is parallel to a long side of the fourth double pinned MR multilayer film, and an angle θ1 is formed between the long side of the first double pinned MR multilayer film and the axis X; and a long side of the second double pinned MR multilayer film is parallel to a long side of the third double pinned MR multilayer film, and an angle θ2 is formed between the long side of the second double pinned MR multilayer film and the axis X, wherein θ1+θ2=180°, and
   the angle between the long side of the first double pinned MR multilayer film and the axis X is between 5 degrees and 85 degrees.

3. The method according to claim 2, wherein, an angle between the magnetization intensity direction of the ferromagnetic free layer of the first double pinned MR multilayer film and the axis X after the second annealing is 180+δ;

an angle between the magnetization intensity direction of the ferromagnetic free layer of the second double pinned MR multilayer film and the axis X after the second annealing is 180−δ;

an angle between the magnetization intensity direction of the ferromagnetic free layer of the third double pinned MR multilayer film and the axis X after the second annealing is 180−δ; and an angle between the magnetization intensity direction of the ferromagnetic free layer of the fourth double pinned MR multilayer film and the axis X after the second annealing is 180+δ, wherein $\delta = \varepsilon - 0.5 \mathrm{atan}\{K1\sin(2\varepsilon)/[Kd+K1\cos(2\varepsilon)]\}$, K1 is magnetocrystalline anisotropy energy, Kd is shape anisotropy energy, ε is an angle between a shape anisotropy axis of the ferromagnetic free layer after the second annealing and the axis X, δ is an angle between an effective anisotropy axis of the ferromagnetic free layer of the first double pinned MR multilayer film after the second annealing and the axis X, and a magnetocrystalline anisotropy axis of the ferromagnetic free layer of the first double pinned MR multilayer film after the second annealing is along the axis X.

* * * * *